(12) United States Patent
Getz et al.

(10) Patent No.: US 12,027,821 B2
(45) Date of Patent: Jul. 2, 2024

(54) BONDED TUNABLE VCSEL WITH BI-DIRECTIONAL ACTUATION

(71) Applicant: Excelitas Technologies Corp., Waltham, MA (US)

(72) Inventors: James W Getz, Brookline, MA (US); Peter S. Whitney, Bedford, MA (US)

(73) Assignee: Excelitas Technologies Corp., Waltham, MA (US)

( * ) Notice: Subject to any disclaimer, the term of this patent is extended or adjusted under 35 U.S.C. 154(b) by 188 days.

(21) Appl. No.: 17/852,268

(22) Filed: Jun. 28, 2022

(65) Prior Publication Data
US 2023/0046578 A1  Feb. 16, 2023

Related U.S. Application Data

(63) Continuation of application No. 16/674,991, filed on Nov. 5, 2019, now Pat. No. 11,431,151.
(Continued)

(51) Int. Cl.
*H01S 5/183* (2006.01)
*B81B 7/02* (2006.01)
(Continued)

(52) U.S. Cl.
CPC ............ *H01S 5/18366* (2013.01); *B81B 7/02* (2013.01); *H01S 5/0215* (2013.01);
(Continued)

(58) Field of Classification Search
CPC ............... H01S 5/18366; H01S 5/0215; H01S 5/18369; H01S 5/0261; H01S 5/02345; B81B 7/02
See application file for complete search history.

(56) References Cited

U.S. PATENT DOCUMENTS

| 5,629,951 A | * | 5/1997 | Chang-Hasnain ........................ H01S 5/18366 372/20 |
| 6,721,098 B2 | | 4/2004 | Atia |

(Continued)

FOREIGN PATENT DOCUMENTS

| JP | 2010-161253 A | 7/2010 |
| JP | 2016-502288 A | 1/2016 |

(Continued)

OTHER PUBLICATIONS

Yano et al., Wavelength modulation over 500 kHz of micromechanically tunable InP-based VCSELs with Si-MEMS technology. IEEE Journal of Selected Topics in Quantum Electronics. May 2, 2009;15(3):528-34.

(Continued)

*Primary Examiner* — Yuanda Zhang
(74) *Attorney, Agent, or Firm* — Wolf, Greenfield & Sacks, P.C.

(57) ABSTRACT

A MEMS tunable VCSEL includes a membrane device having a mirror and a distal-side electrostatic cavity for displacing the mirror to increase a size of an optical cavity. A VCSEL device includes an active region for amplifying light. Then, a proximal-side electrostatic cavity is defined between the VCSEL device and the membrane device is used to displace the mirror to decrease a size of an optical cavity.

20 Claims, 5 Drawing Sheets

Related U.S. Application Data

(60) Provisional application No. 62/755,796, filed on Nov. 5, 2018.

(51) Int. Cl.
  *H01S 5/02* (2006.01)
  *H01S 5/02345* (2021.01)
  *H01S 5/026* (2006.01)
  *H01S 5/04* (2006.01)

(52) U.S. Cl.
  CPC ........ *H01S 5/02345* (2021.01); *H01S 5/0261* (2013.01); *H01S 5/041* (2013.01); *H01S 5/18355* (2013.01); *H01S 5/18369* (2013.01)

(56) References Cited

U.S. PATENT DOCUMENTS

| | | |
|---|---|---|
| 7,420,738 B2 | 9/2008 | Verghese |
| 10,109,979 B2 | 10/2018 | Flanders et al. |
| 10,951,009 B2 | 3/2021 | Johnson et al. |
| 11,431,151 B2 | 8/2022 | Getz et al. |
| 2002/0080504 A1 | 6/2002 | Atia |
| 2008/0159468 A1 | 7/2008 | Chong |
| 2014/0176958 A1 | 6/2014 | Flanders et al. |
| 2015/0010031 A1 | 1/2015 | Makino et al. |
| 2015/0043002 A1 | 2/2015 | Kuznetsov et al. |
| 2015/0049341 A1 | 2/2015 | Fujii et al. |
| 2015/0311664 A1 | 10/2015 | Bulovic et al. |
| 2015/0380903 A1 | 12/2015 | Nagatomo |
| 2019/0348813 A1 | 11/2019 | Flanders et al. |
| 2019/0348815 A1 | 11/2019 | Johnson et al. |
| 2020/0144793 A1 | 5/2020 | Getz et al. |

FOREIGN PATENT DOCUMENTS

| | | |
|---|---|---|
| JP | 2016-523444 A | 8/2016 |
| WO | WO 2014-100564 A1 | 6/2014 |
| WO | WO 2015-003023 A1 | 1/2015 |

OTHER PUBLICATIONS

International Search Report and Written Opinion for International Application No. PCT/US2019/059903 mailed Apr. 3, 2020.
International Preliminary Report on Patentability for International Application No. PCT/US2019/059903 mailed May 20, 2021.

* cited by examiner

BONDED TUNABLE VCSEL WITH BI-DIRECTIONAL ACTUATION

CROSS-REFERENCE TO RELATED APPLICATIONS

This application is a continuation of U.S. patent application Ser. No. 16/674,991, filed on Nov. 5, 2019, entitled "BONDED TUNABLE VCSEL WITH BI-DIRECTIONAL ACTUATION," which claims the benefit under 35 USC 119(e) of U.S. Provisional Application No. 62/755,796, filed on Nov. 5, 2018, entitled "BONDED TUNABLE VCSEL WITH BI-DIRECTIONAL ACTUATION." The contents of these applications are incorporated herein by reference in their entirety.

BACKGROUND OF THE INVENTION

Optical coherence analysis relies on the use of the interference phenomena between a reference wave and an experimental wave or between two parts of an experimental wave to measure distances and thicknesses, and calculate indices of refraction of a sample. Optical Coherence Tomography (OCT) is one example technology that is used to perform high-resolution cross sectional imaging. It is often applied to imaging biological tissue structures, for example, on microscopic scales in real time. Optical waves are reflected from an object or sample and a computer produces images of cross sections or three-dimensional volume renderings of the sample by using information on how the waves are changed upon reflection.

There are a number of different classes of OCT, but Fourier domain OCT currently offers the best performance for many applications. Moreover, of the Fourier domain approaches, swept-source OCT has distinct advantages over techniques such as spectrum-encoded OCT because it is compatible with balanced and polarization diversity detection. It also has advantages for imaging in wavelength regions where inexpensive and fast detector arrays, which are typically required for spectrum-encoded OCT, are not available.

In swept source OCT, the spectral components are not encoded by spatial separation, but they are encoded in time. The spectrum is either filtered or generated in successive optical frequency sampling intervals and reconstructed before Fourier-transformation. Using the frequency scanning swept source, the optical configuration becomes less complex but the critical performance characteristics now reside in the source and especially its frequency sweep rate and tuning accuracy.

High speed frequency tuning, or high sweep rates, for OCT swept sources is especially relevant to in-vivo imaging where fast imaging reduces motion-induced artifacts and reduces the length of the patient procedure. It can also be used to improve resolution.

Historically, microelectromechanical systems (MEMS)-tunable vertical-cavity surface-emitting lasers (VCSELs) have been used in telecommunications applications. Their tunability enabled a single laser to cover multiple channels of the ITU wavelength division multiplexing grid.

More recently, these MEMS tunable VCSELs have been proposed as the swept sources in swept source OCT systems. Here, they have a number of advantages. Their short optical cavity lengths combined with the low mass of their deflectable MEMS membrane mirrors enable high sweep speeds. Moreover, they are capable of single longitudinal mode operation and are not necessarily subject to mode hopping noise. These characteristics also contribute to long coherence lengths for deep imaging.

In one example, a MEMS tunable VCSEL uses a VCSEL chip or device with an indium phosphide (InP)-based quantum-well active region with a gallium arsenide (GaAs)-based oxidized mirror. An electrostatically actuated dielectric mirror is suspended over the active region and separated by an air gap that forms part of the electrostatic cavity for the dielectric mirror. This electrostatically actuated mirror is monolithically fabricated on top of the VCSEL device. The MEMS VCSEL is then optically pumped by a 980 nanometer (nm) laser, for example.

Monolithically forming the MEMS dielectric mirror on the VCSEL creates a number of disadvantages, however. First, any processes required to form MEMS mirror must be compatible with the chemistry of the VCSEL. Moreover, the complex fabrication sequence impacts manufacturing yields.

Another class of MEMS tunable VCSELs relies on bonding a MEMS mirror device to a VCSEL device. This allows for a separate electrostatic cavity, that is outside the laser's optical resonant cavity. Moreover, the use of this cavity configuration allows the MEMS mirror to be tuned by pulling the mirror away from the active region and the surface of the VCSEL device. This reduces the risk of snap down. Moreover, since the MEMS mirror device is now bonded to the VCSEL device, much wider latitude is available in the technologies that are used to fabricate the MEMS mirror device.

SUMMARY OF THE INVENTION

The present invention concerns MEMS tunable VCSELs. Different from prior tunable VCSELs, however, the mirror can be pulled in the direction of the VCSEL device or pulled away from that device. Moreover, in some of the embodiments and/or modes of operation, the mirror can be pulled in either direction in a dynamic fashion. In other cases, it might be pulled to an initial position and then pulled further in that direction or pulled in the other direction.

In general, according to one aspect, the invention features a MEMS tunable VCSEL. It comprises a membrane device having mirror and a distal-side electrostatic cavity for displacing the mirror to increase a size of an optical cavity. A VCSEL device includes an active region for amplifying light. Then, a proximal-side electrostatic cavity is defined between the VCSEL device and the membrane device for displacing the mirror to decrease a size of an optical cavity.

In general, according to another aspect, the invention features a tunable vertical cavity surface emitting laser (VCSEL). It comprises a VCSEL device including an active region for amplifying light and a membrane device, bonded to the VCSEL device, having mirror and a distal-side electrostatic cavity for displacing the mirror to increase a size of an optical cavity. A proximal-side electrostatic cavity is defined between the VCSEL device and the membrane device for displacing the mirror to decrease a size of the optical cavity.

In embodiments, the membrane device is metal bonded to the VCSEL. Also, the proximal-side electrostatic cavity can be defined between a membrane structure of the membrane device and a proximal-side electrostatic cavity electrode metal layer on the VCSEL device. Further, a wire bond pad on the membrane device might be electrically connected to the proximal-side electrostatic cavity electrode metal layer.

Further, the membrane structure can be doped for increased conductivity.

Preferably, the VCSEL is protected against damage due to electrical overstress of the proximal-side electrostatic cavity by ensuring that the gap in the electrostatic cavity is prevented from going to 0 by use of an insulating stand-off. This insulating stand off can be the high reflective dielectric coating.

Preferably, a distal-side electrostatic cavity driver is used to apply a voltage to the membrane device, and a proximal-side electrostatic cavity driver is used to apply a voltage to the VCSEL device.

There can be wire bond pads on the membrane device to which the distal-side electrostatic cavity driver and the distal-side electrostatic cavity driver connect.

In general, according to another aspect, the invention features method of operation of a tunable vertical cavity surface emitting laser (VCSEL). This method comprises amplifying light in an active region of a VCSEL device, defining an optical cavity for the light between a mirror layer of the VCSEL device and a mirror of a membrane device, using a distal-side electrostatic cavity to displace the mirror to increase a size of the optical cavity, and using a proximal-side electrostatic cavity to displace the mirror to decrease a size of the optical cavity using a proximal-side electrostatic cavity.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
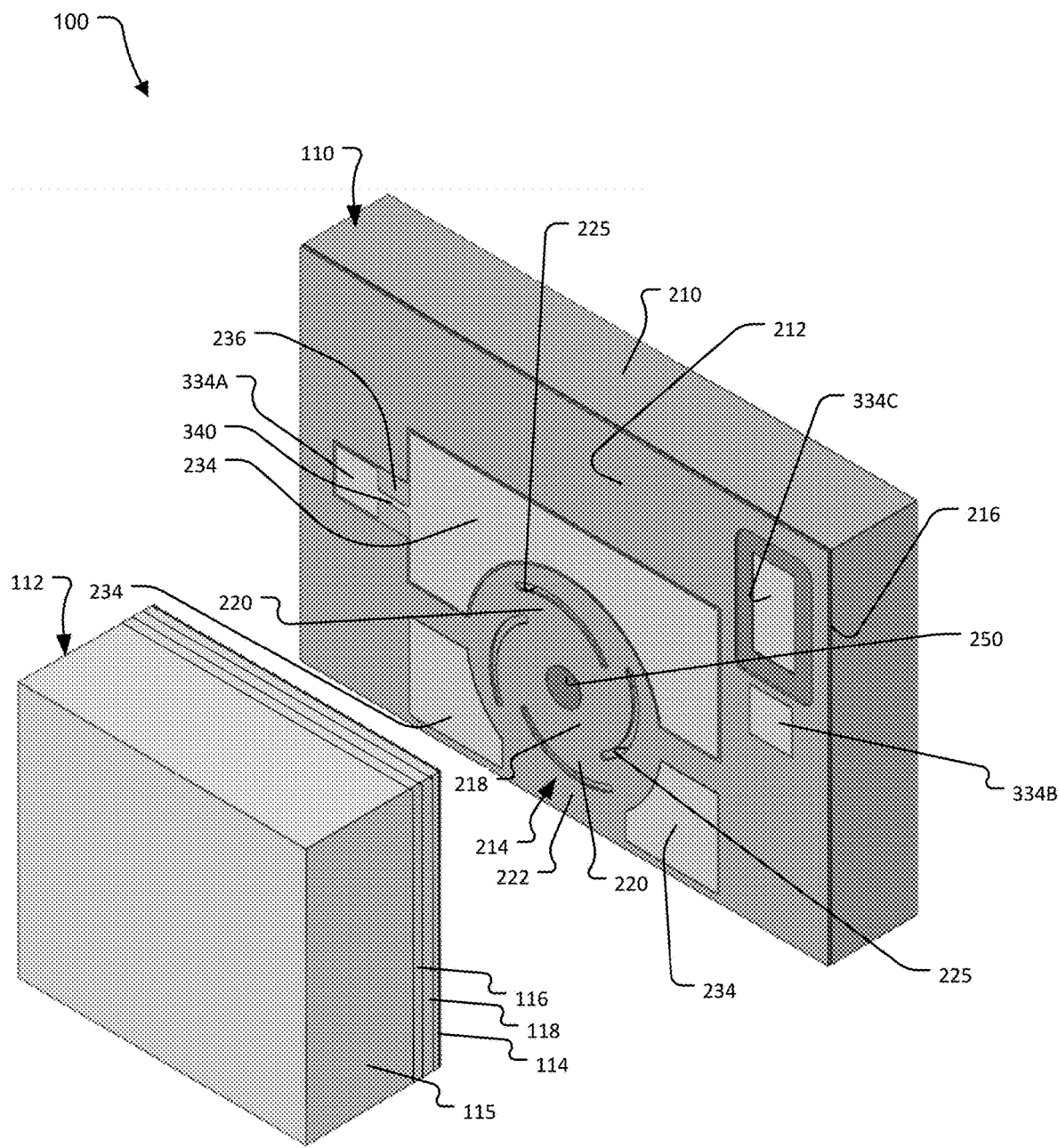
FIG. 1 is an exploded perspective view of a MEMS tunable VCSEL according to the present invention.

FIG. 1 shows a MEMS tunable VCSEL 100 comprising a MEMS membrane (mirror) device 110 that is bonded to an VCSEL chip or device 112, which has been constructed according to the principles of the present invention.

In the illustrate design, there is no separate spacer device separating MEMS mirror device 110 from the VCSEL device 112. The general objective is to make the optical cavity of the tunable VCSEL 100 as small as possible. Thus, in order to control the size of a free space portion of the optical cavity, various material layers are deposited on the MEMS mirror device 110 and/or the VCSEL device 112 in order to control the gap. This gap defines the free space portion, which extends between the surface of the VCSEL device and the surface of the MEMS mirror device. In addition, according to the invention, a proximal-side electrostatic cavity also extends between the MEMS mirror device 110 and/or the VCSEL device 112.

The optical membrane device 110 comprises handle wafer material 210 that functions as a support. Currently, the handle is made from doped silicon, with resistivity <0.1 ohm-cm, carrier concentration >$1\times10^{17}$ cm$^{-3}$, to facilitate electrical contact.

An optical membrane or device layer 212 is added to the handle wafer material 210. Typically silicon on isolator (SOI) wafers are used. The membrane structure 214 is formed in this optical membrane layer 212. In the current implementation, the membrane layer 212 is silicon that is low doped with resistivity >1 ohm-cm, carrier concentration <$5\times10^{15}$ cm$^{-3}$, to minimize free carrier absorption of the transmitted light. For electrical contact, the membrane layer surface is usually additionally doped with ion implantation to create a highly doped surface layer (doped usually to >$1\times10^{18}$ cm$^{-3}$, but at least $1\times10^{17}$ cm$^{-3}$ and at least 200 Angstroms (A) thick, usually 500-2000 A thick). This method minimizes optical absorption in the membrane layer itself that would occur if the entire layer were highly doped. An insulating (buried silicon dioxide) layer 216 separates the optical membrane layer 212 from the handle wafer material 210. Typically silicon on isolator (SOI) wafers are used.

During manufacture, the insulating layer 216 functions as a sacrificial/release layer, which is partially removed to release the membrane structure 214 from the handle wafer material 210. Then during operation, the remaining portions of the insulating layer 216 provide electrical isolation between the patterned device layer 212 and the handle material 210.

In the current embodiment, the membrane structure 214 comprises a body portion 218. The optical axis of the device 100 passes concentrically through this body portion 218 and orthogonal to a plane defined by the membrane layer 212. A diameter of this body portion 218 is preferably 300 to 600 micrometers; currently it is about 500 micrometers.

Tethers 220 (four tethers in the illustrated example) defined by arcuate slots 225 fabricated into the device layer 212. The tethers 220 extend radially from the body portion 218 to an outer portion 222, which comprises the ring where the tethers 220 terminate. In the current embodiment, a spiral tether pattern is used.

A membrane mirror dot 250 is disposed on body portion 218 of the membrane structure 214. In some embodiments, the membrane mirror 250 is an optically curved to form an optically concave optical element to thereby form a curved mirror laser cavity. In other cases, the membrane mirror 250 is a flat mirror, or even possibly convex.

When a curved membrane mirror 250 is desired, this curvature can be created by forming a depression in the body portion 218 and then depositing the material layer or layers that form mirror 250 over that depression. In other examples, the membrane mirror 250 can be deposited with a high amount of compressive material stress that will result in its curvature.

The membrane mirror dot 250 is preferably a reflecting dielectric mirror stack. In some examples, it is a dichroic mirror-filter that provides a defined reflectivity, such as between 1 and 10%, to the wavelengths of laser light generated in the laser 100, whereas the optical dot 250 is transmissive to wavelengths of light that are used to optically pump the active region in the VCSEL device 112. In still other examples, the optical dot is a reflective metal layer such as aluminum or gold.

In the illustrated embodiment, three metal pads 234 are deposited on the proximal side of the membrane device 110. These are used to solder or thermocompression bond, for example, the VCSEL device 112 onto the proximal face of the membrane device 110. The top pad also provides an electrical connection to the VCSEL device 112.

Also provided are three wire bondpads 334A, 334B, and 334C. The left VCSEL electrode wire bond pad 334A is used to provide an electrical connection to the metal pads 234. On the other hand, the right membrane wire bond pad 334B is used to provide an electrical connection to the membrane layer 212 and thus the membrane structure 214. Finally, the handle wire bond pad 334C is used to provide an electrical connection to the handle wafer material 210.

The VCSEL device 112 generally comprises an antireflective coating 114, which is optional, and an active region 118, which preferably has a single or multiple quantum well structure. The cap layer can be used between the antireflective coating 114, if present, and the active region 118. The cap layer protects the active region from the surface/interface effects at the interface to the AR coating and/or air. The back mirror 116 of the laser cavity is defined by a distributed Bragg reflector (DBR) mirror. Finally, a VCSEL spacer 115, such as GaAS, functions as a substrate and mechanical support.

The material system of the active region 118 of the VCSEL device 112 is selected based on the desired spectral operating range. Common material systems are based on III-V semiconductor materials, including binary materials, such as GaN, GaAs, InP, GaSb, InAs, as well as ternary, quaternary, and pentenary alloys, such as InGaN, InAlGaN, InGaP, AlGaAs, InGaAs, GaInNAs, GaInNAsSb, AlInGaAs, InGaAsP, AlGaAsSb, AlGaInAsSb, AlAsSb, InGaSb, InAsSb, and InGaAsSb. Collectively, these material systems support operating wavelengths from about 400 nanometers (nm) to 2000 nm, including longer wavelength ranges extending into multiple micrometer wavelengths. Semiconductor quantum well and quantum dot gain regions are typically used to obtain especially wide gain and spectral emission bandwidths.

In the preferred embodiment, the polarization of the light generated by the MEMS tunable VCSEL 100 is preferably controlled and at least stabilized. In general, this class of devices has a cylindrical resonator that emits linearly polarized light. Typically, the light is polarized along the crystal directions with one of those directions typically being stronger than the other. At the same time, the direction of polarization can change with laser current or pumping levels, and the behaviors often exhibit hysteresis.

Different approaches can be taken to control the polarization. In one embodiment, polarization selective mirrors are used. In another example, non-cylindrical resonators are used. In still a further embodiment, asymmetrical current injection is used when electrical pumping is employed. In still other examples, the active region substrate includes trenches or materials layers, which result in an asymmetric stress, strain, heat flux or optical energy distribution, are used in order to stabilize the polarization along a specified stable polarization axis. In still a further example, asymmetric mechanical stress is applied to the VCSEL device 112 as described in "Tunable VCSEL polarization control through dissimilar die bonding" by Bartley C. Johnson, et al. U.S. patent application Ser. No. 16/409,295, filed on May 10, 2019, which is incorporated herein by this reference, hereinafter Johnson.

Defining the other end of the laser cavity is the rear mirror 116 that is formed in the VCSEL device 112. In one example, this is a layer adjacent to the active region 116 that creates the refractive index discontinuity that provides for a portion of the light to be reflected back into the cavity, such as between one and 10%. In other examples, the rear mirror 116 is a high reflecting layer that reflects over 90% of the light back into the laser cavity.

In still other examples, the rear VCSEL distributed Bragg reflector (DBR) mirror 116 is a dichroic mirror-filter that provides a defined reflectivity, such as between 1 and 100%, to the wavelengths of laser light generated in the laser 100, whereas the rear mirror 116 is transmissive to wavelengths of light that are used to optically pump the active region in the VCSEL device 112, thus allowing the VCSEL device 112 to function as an input port of pump light.

Figure 2:
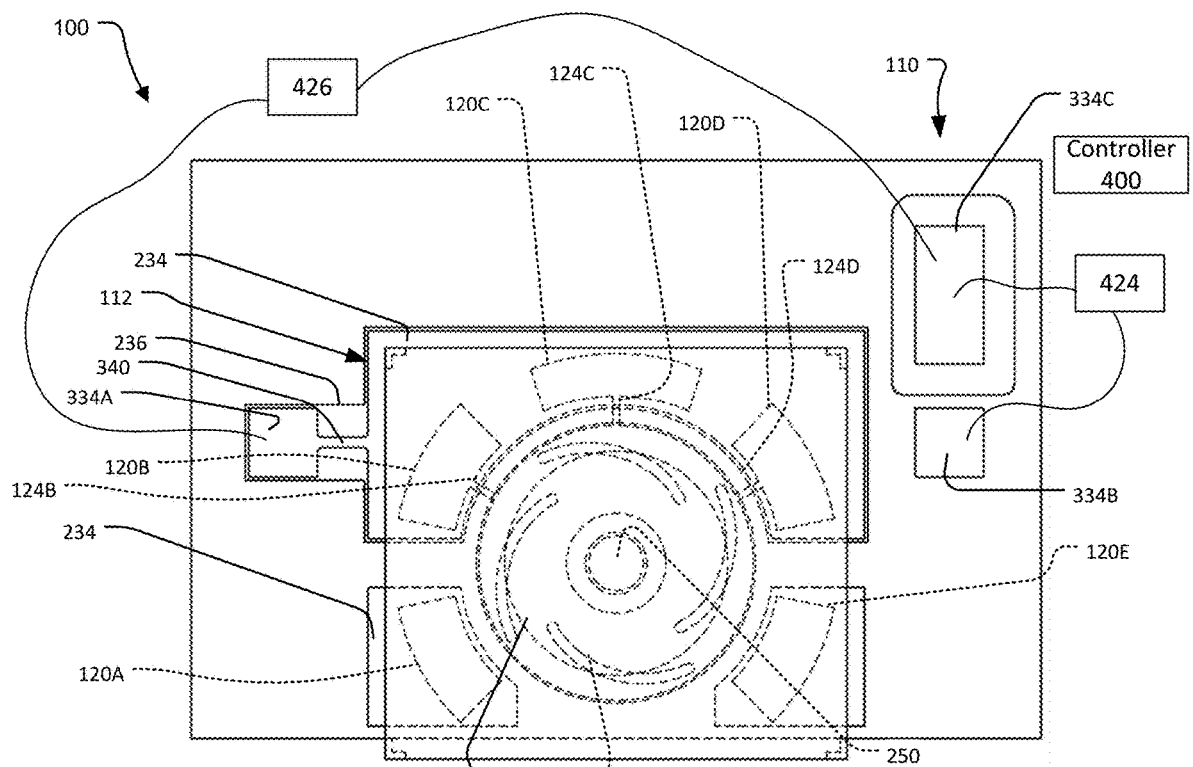
FIG. 2 is a front plan view showing the MEMS tunable VCSEL with the VCSEL device shown in phantom.

FIG. 2 is front view showing the MEMS tunable VCSEL 100 with the VCSEL device 112 shown in phantom.

Notably, the view shows the arrangement of the VCSEL device bond pads 120A-120E that are arrayed in an arc on the proximal side of the VCSEL device 112 to enable it to be bonded to the bond pads 234 of the optical membrane device 110.

Figure 3:
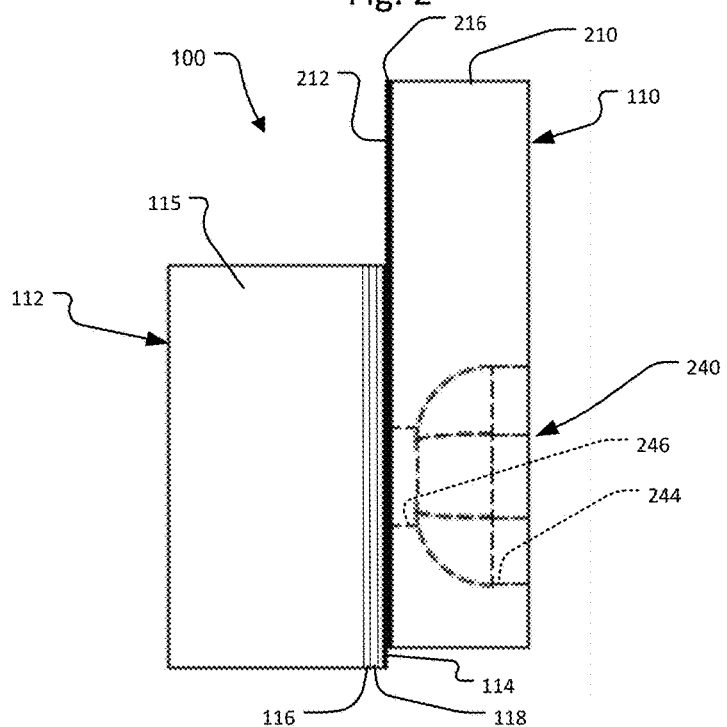
FIG. 3 is a side plan view showing the MEMS tunable VCSEL with the MEMS mirror device's optical port shown in phantom.

FIG. 3 shows the MEMS tunable VCSEL 100 in side cross-section.

An optical port 240 is provided, extending from a distal side of the handle wafer material 210 to the membrane structure in cases where the mirror 250 is used as an output reflector or to provide for monitoring. If the reflector 250 is used as a back reflector, then the port 240 is not necessary in some cases.

Further, whether or not this optical port 240 is required also depends upon the transmissivity of the handle wafer material 210 at the optical wavelengths over which the MEMS tunable VCSEL 100 must operate. Typically, with no port, the handle wafer material 210 along the optical axis must be anti-reflection coated (AR) coated if transmission through the backside is required for functionality.

Figure 4:
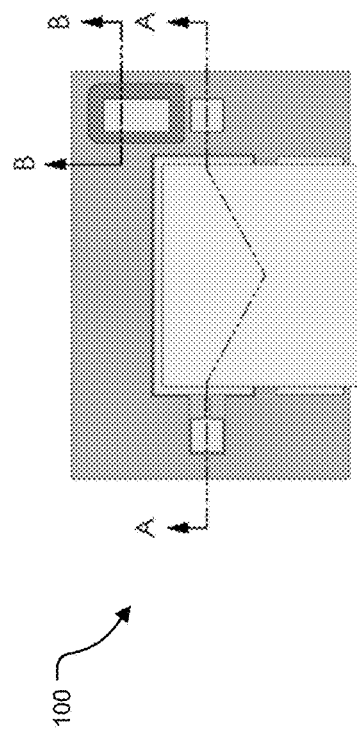
FIG. 4 is a front plan view showing the MEMS tunable VCSEL.

FIG. 4 is front view showing the MEMS tunable VCSEL 100 showing section lines A-A and B-B.

Figure 5:
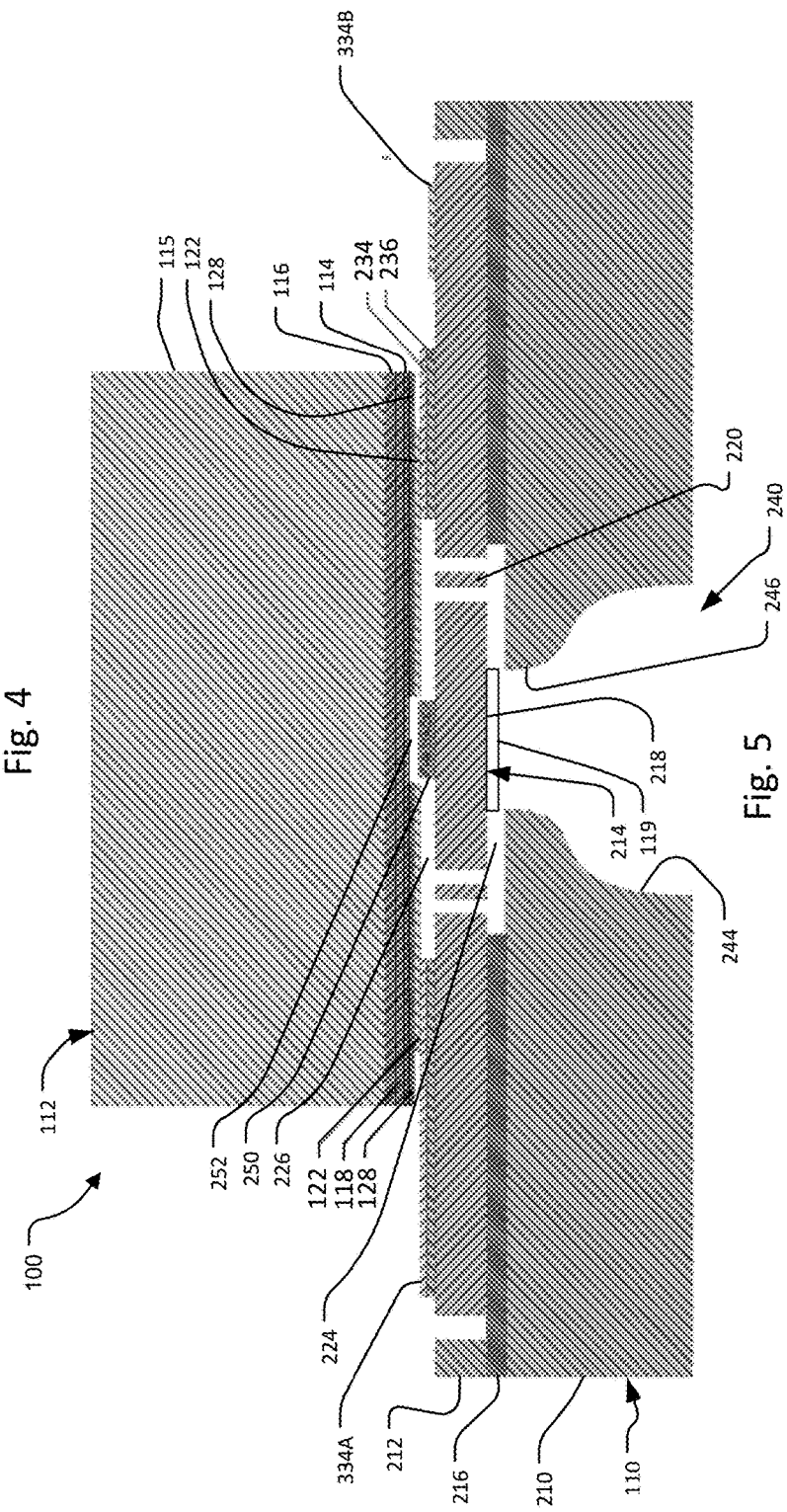
FIG. 5 is a cross-section taken along line A-A of FIG. 4.

FIG. 5 schematically shows the MEMS tunable VCSEL 100 in cross-section along A-A to show a proximal-side electrostatic cavity and a distal-side electrostatic cavity 224.

The optical port 240 has generally inward sloping sidewalls 244 that end in the port opening 246. As a result, looking through the distal side of the handle wafer 210, the body portion 218 of the membrane structure 214 is observed. The port is preferably concentric with the membrane mirror dot 250. Further, the backside of the body portion 218 is coated with a membrane backside AR coating 119 in some examples. This AR coating 119 is used to facilitate the coupling of pump light into the laser cavity and/or the coupling of laser light out of the cavity. In still other examples, it is reflective to pump light to return pump light back into the laser cavity.

The thickness of insulating layer 216 defines the electrostatic cavity length of the distal-side electrostatic cavity 224. Presently, the insulating layer 216 is between 3.0 and 6.0 μm thick. It is a general rule of thumb, that electrostatic elements can be tuned over no greater than one third the distance of the electrostatic cavity. As result, the body portion 218, and thus the mirror optical coating 230 can be deflected between 1 and 3 μm in the distal direction (i.e., away from the VCSEL device 112), in one embodiment.

Also shown are details concerning how the VCSEL device 112 is bonded to the membrane device 110. The MEMS device bond pads 234 bond to VCSEL proximal-side electrostatic cavity electrode metal 122. These metal layers are electrically isolated. Specifically, the MEMS device bond pads 234 are separated from the membrane layer 212 by MEMS device bond pad isolation oxide 236; the VCSEL proximal-side electrostatic cavity electrode metal 122 is isolated from the remainder of the VCSEL device by the VCSEL isolation oxide layer 128. Neither of the VCSEL proximal-side electrostatic cavity electrode metal 122 nor the VCSEL isolation oxide layer 128 interfere with the optical operation since they do not extend into the region of the free-space portion 252 of the laser's optical cavity.

The distal-side electrostatic cavity 224 and the proximal-side electrostatic cavity 226 are located on either side of the membrane structure 214. Specifically, the distal-side electrostatic cavity 224 is created between the handle wafer material 210 and the membrane structure 214, which is the suspended portion of the membrane layer 212. A voltage potential between the handle wafer material 210 and the membrane layer 212 will generate an electrostatic attraction between the layers and pull the membrane structure 214 toward the handle wafer material 210. On the other hand, the proximal-side electrostatic cavity 226 is created between the membrane structure 214 and the VCSEL proximal-side electrostatic cavity electrode metal 122. A voltage potential between the membrane layer 212 and the VCSEL proximal-side electrostatic cavity electrode metal 122 will generate an electrostatic attraction between the layers and pull the membrane structure 214 toward the VCSEL device 112.

In general, the size of the proximal-side electrostatic cavity 226 measured along the device' optical axis is defined by the bond metal thickness, thickness of VCSEL proximal-side electrostatic cavity electrode metal 122 and MEMS device bond pads 234 along with the thicknesses VCSEL isolation oxide layer 128 and MEMS device bond pad isolation oxide 236.

The minimum oxide thickness is determined by the required voltage isolation. Oxide break down is nominally 1000V/micrometer. So, for 200V isolation that would be 2000 A, which is preferably doubled for margin. So the thickness of layers of VCSEL isolation oxide layer 128 and MEMS device bond pad isolation oxide 236 is greater than 4000 A.

The current metal bond thickness is 6000 A (each layer) with approx. 3000 A compression during bonding. Based on this, the minimum size of the proximal-side electrostatic cavity 226 is 0.85 micrometers.

At this minimum electrostatic gap point, a zero optical gap results when the membrane mirror dot 250 is 1.7 micrometers thick.

To increase the optical gap, the thickness of the VCSEL isolation oxide layer 128 can be increased without effecting the operation of the cavity.

In one embodiment, the layer thicknesses of VCSEL antireflective coating 114, VCSEL proximal-side electrostatic cavity electrode metal 122, MEMS device bond pads 234, and MEMS device bond pad isolation oxide 236 and for the HR coating (250) are such that, under conditions of electrical overstress as the deflectable membrane structure (214) is pulled towards the VCSEL device (112), the surface of the membrane mirror dot 250 will touch the surface of the VCSEL device 112 before the membrane structure 214 can come into contact with the VCSEL proximal side electrode metal 122. The contact of the membrane to the highly conductive VCSEL electrode metal can cause permanent electrical damage to the device, whereas the membrane mirror dot 250 is an insulator. This feature protects the device against damage from such electrical overstress.

On the other hand, isolation oxide layer 128 is not necessary. In fact, if the VCSEL device is not isolated then the active area is also charged the same as the metal electrode. Since the HR coating 250 stack is a dielectric, the equivalent to an air gap from the membrane to the VCSEL is less. This appears to give a significant kick in electrostatic force as the membrane and HR stack is pulled in.

Figure 6:
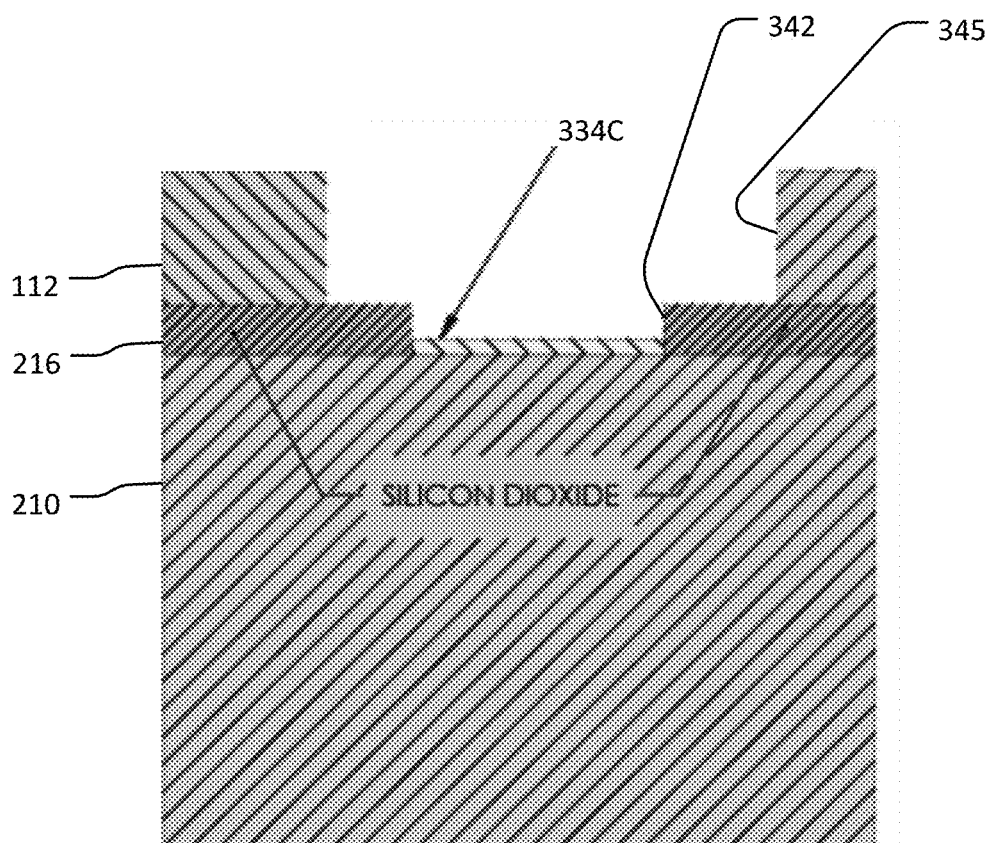
FIG. 6 is a detailed cross-section taken along line B-B of FIG. 4.

FIG. 6 is a cross-section along B-B and shows a portion of the membrane device 110 in the region of the handle wire bond pad 334C.

The handle wire bond pad 334C is fabricated by forming a hole 345 through the membrane layer 112 and another hole 342 through the buried oxide insulating layer 216. This exposes the handle wafer material 210, on which the handle wire bond pad 334C is deposited.

Figure 7:
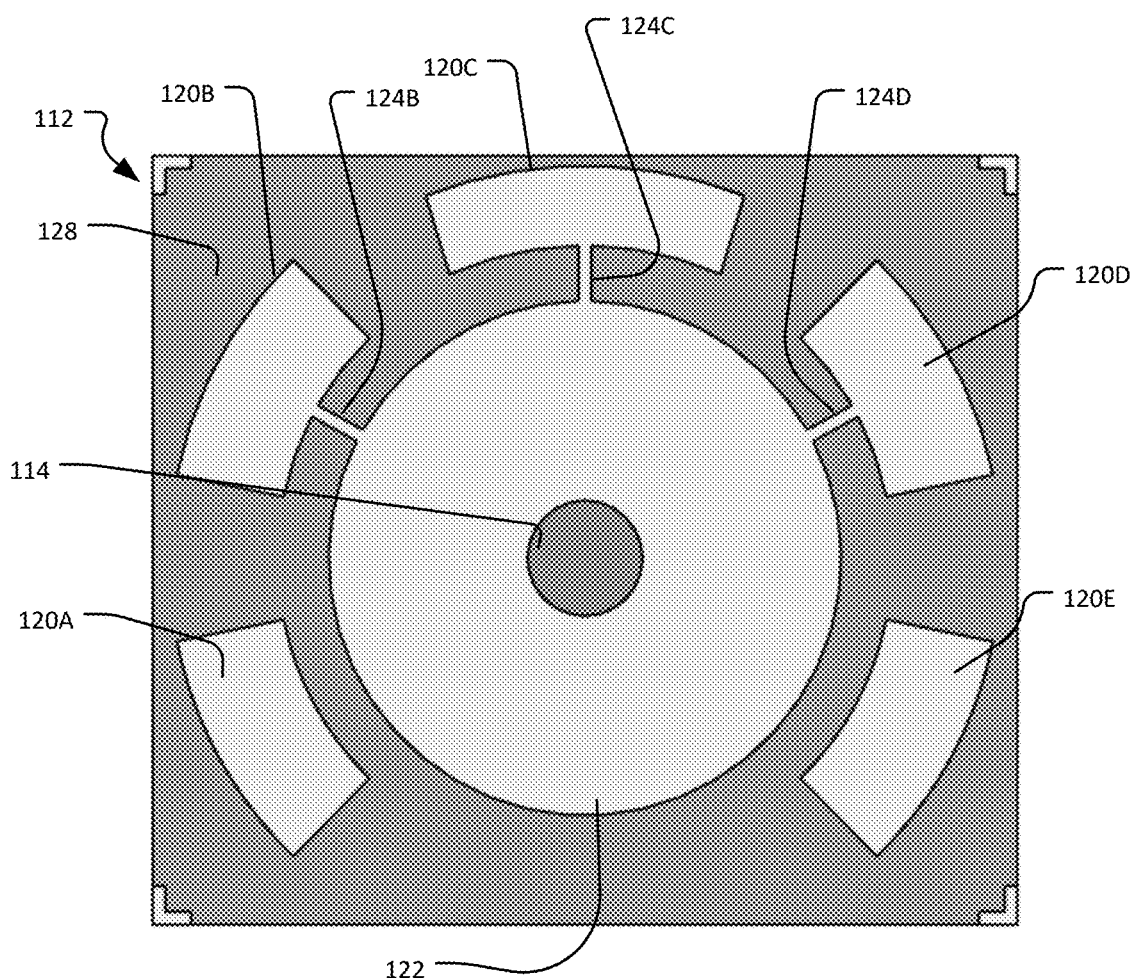
FIG. 7 is a plan view showing the VCSEL device.

FIG. 7 shows the metal pattern on the proximal side of the VCSEL device 112.

In some examples, only 4 pads are used however. The top pad 120C is eliminated to provide a preferential stress direction for polarization control as described in Johnson.

The VCSEL proximal-side electrostatic cavity electrode metal 122 covers the center portion of the proximal side of the VCSEL device 112, but for the very center, wherein the VCSEL antireflective coating 114 remains exposed.

The VCSEL proximal-side electrostatic cavity electrode metal 122 is electrically connected to VCSEL device bond pads 120B-120D by respective VCSEL bond pad-electrode bridges 124B-124D.

When assembled, the VCSEL proximal-side electrostatic cavity electrode metal 122 is electrically connected to the VCSEL electrode wire bondpads 334A by the metal bond between the VCSEL device bond pads 120B, 120C, 120D and MEMS device bond pads 234. The MEMS device bond pads 234 in turn are electrically connected to the VCSEL proximal-side electrostatic cavity electrode metal 122 by the VCSEL bridge metal 340.

Thus, with reference to FIG. 2, a distal-side electrostatic cavity driver 424 applies a voltage between the handle wafer material 210 via the handle wire bond pad 334C and the membrane layer 212 via the membrane wire bond pad 334B. A proximal-side electrostatic cavity driver 426 applies a voltage between the handle wafer material 210 via the handle wire bond pad 334C and the VCSEL 112 or specifically the VCSEL proximal-side electrostatic cavity electrode metal 122 via the left VCSEL electrode wire bond pad 334A. In this way, a controller 400 controls the proximal-side electrostatic cavity 226 by controlling the proximal-side electrostatic cavity driver 426 to translate the body portion 214 of the membrane layer 212 toward the VCSEL device 112, and controller 400 controls the distal-side electrostatic cavity 224 by controlling distal side electrostatic driver 424 to translate the body portion 214 of the membrane layer 212 toward the handle material 210.

While this invention has been particularly shown and described with references to preferred embodiments thereof, it will be understood by those skilled in the art that various changes in form and details may be made therein without departing from the scope of the invention encompassed by the appended claims.

What is claimed is:

1. A tunable vertical cavity surface emitting laser (VCSEL), comprising:
    a VCSEL device comprising:
        a substrate;
        an active region configured for light amplification;
        an electrode; and
        a VCSEL isolation layer disposed between the substrate and the electrode;
    a membrane device, bonded to the electrode of the VCSEL device, comprising:
        a handle wafer;
        a first mirror coupled to a membrane structure; and
        an insulating layer, disposed between the handle wafer and the membrane structure, defining a distal-side electrostatic cavity; and
    wherein the VCSEL device and the membrane device define a proximal-side electrostatic cavity therebetween.

2. The tunable VCSEL of claim 1, wherein the proximal-side electrostatic cavity is configured for displacement of the first mirror toward the VCSEL device.

3. The tunable VCSEL of claim 2, further comprising a controller configured to apply a voltage between the membrane structure and the electrode of the VCSEL device.

4. The tunable VCSEL of claim 1, wherein the distal-side electrostatic cavity is configured for displacement of the first mirror away from the VCSEL device.

5. The tunable VCSEL of claim 4, further comprising a controller configured to apply a voltage between the membrane structure and the handle wafer of the membrane device.

6. The tunable VCSEL of claim 1, wherein the proximal-side electrostatic cavity is bounded by the electrode of the VCSEL device and the membrane structure.

7. The tunable VCSEL of claim 1, wherein the distal-side electrostatic cavity is bounded by the handle wafer of the membrane device and the membrane structure.

8. The tunable VCSEL of claim 1, wherein the VCSEL device further comprises a second mirror disposed between the substrate and the active region, wherein the first mirror and the second mirror define a tunable optical cavity.

9. The tunable VCSEL of claim 1, wherein the VCSEL device further comprises an antireflective coating disposed between the electrode and the active region.

10. The tunable VCSEL of claim 1, wherein the VCSEL isolation layer comprises oxide.

11. The tunable VCSEL of claim 1, wherein the membrane device further comprises a bond pad coupled to the electrode of the VCSEL device.

12. The tunable VCSEL of claim 11, wherein the membrane device further comprises a bond pad isolation oxide coupled to the bond pad.

13. The tunable VCSEL of claim 12, wherein the bond pad isolation oxide and the VCSEL isolation layer, collectively, have a thickness greater than 4000 angstroms.

14. A tunable vertical cavity surface emitting laser (VCSEL), comprising:
    a VCSEL device comprising a substrate, an active region configured for light amplification, an electrode, and a VCSEL isolation layer disposed between the substrate and the electrode;
    a membrane device, bonded to the electrode of the VCSEL device, comprising a first mirror coupled to a membrane structure;
    means for displacing the first mirror toward the VCSEL device; and
    means for displacing the first mirror away from the VCSEL device.

15. The tunable VCSEL of claim 14, wherein the VCSEL device further comprises a second mirror, wherein the first mirror and the second mirror define a tunable optical cavity, wherein the active region is disposed in the optical cavity.

16. The tunable VCSEL of claim 14, wherein the VCSEL device further comprises an antireflective coating disposed between the electrode and the active region.

17. The tunable VCSEL of claim 14, wherein the VCSEL isolation layer comprises oxide.

18. The tunable VCSEL of claim 14, wherein the means for displacing the first mirror toward the VCSEL device comprises a controller coupled to the electrode of VCSEL device and the membrane structure.

19. The tunable VCSEL of claim 14, wherein the means for displacing the first mirror away from the VCSEL device comprises a controller coupled to the membrane structure and a handle wafer of the membrane device.

20. The tunable VCSEL of claim 14, wherein the first mirror comprises a stack of dielectric layers.

* * * * *